United States Patent [19]

Stewart

[11] 4,027,236
[45] May 31, 1977

[54] VOLTAGE AND CONTINUITY CHECKER
[75] Inventor: Phillip M. Stewart, Portage, Mich.
[73] Assignee: Triple S Products Company, Vicksburg, Mich.
[22] Filed: July 14, 1976
[21] Appl. No.: 705,270
[52] U.S. Cl. .............................. 324/51; 324/72.5; 324/133
[51] Int. Cl.[2] ................. G01R 31/02; G01R 19/16
[58] Field of Search ........... 324/51, 72.5, 133, 149, 324/53

[56] References Cited

UNITED STATES PATENTS

| | | | |
|---|---|---|---|
| 3,529,237 | 9/1970 | Kilchhofer | 324/51 |
| 3,872,384 | 3/1975 | Laass | 324/51 |
| 3,914,687 | 10/1975 | Bevins | 324/51 |
| 3,919,631 | 11/1975 | Brown | 324/51 |
| 3,934,195 | 1/1976 | Shires | 324/72.5 |
| 3,962,630 | 6/1976 | Chaffee | 324/51 |

FOREIGN PATENTS OR APPLICATIONS

| | | | |
|---|---|---|---|
| 212,925 | 1/1961 | Austria | 324/149 |
| 1,407,867 | 6/1965 | France | 324/51 |
| 1,806,375 | 2/1970 | Germany | 324/133 |
| 1,931,994 | 1/1970 | Germany | 324/51 |
| 956,913 | 4/1964 | United Kingdom | 324/51 |

OTHER PUBLICATIONS

Loiselle, J. T., Low–Voltage and Current Continuity Tester, IBM Technical Disclosure Bulletin, vol. 12, No. 7, Dec. 1969, p. 926.

Primary Examiner—Gerard R. Strecker
Attorney, Agent, or Firm—Woodhams, Blanchard and Flynn

[57] ABSTRACT

A portable test instrument for testing electrical continuity, and diode polarity, AC and DC voltage amplitudes and DC voltage polarity. An electronic switch device has main electrodes connected in an indicating circuit with an electrical supply, a light-emitting diode and a current-limiting resistor. A double pole, double throw switch is manually switchable between continuity and voltage test positions, and with four resistors defines an input circuit interposed between the control electrode of the electronic switch device and probes connectible to a circuit or the like to be tested. In both the voltage and continuity test modes of the instrument, the light-emitting diode is energized only by current from the electrical supply within the indicating circuit. Though proper circuit operation is obtained by manual manipulation of the mode switch between its voltage and continuity positions, the light-emitting diode is automatically protected from damage should the test probes engage a voltage circuit (within the operating voltage range of the instrument) while the instrument is in continuity mode.

6 Claims, 3 Drawing Figures

U.S. Patent May 31, 1977 4,027,236
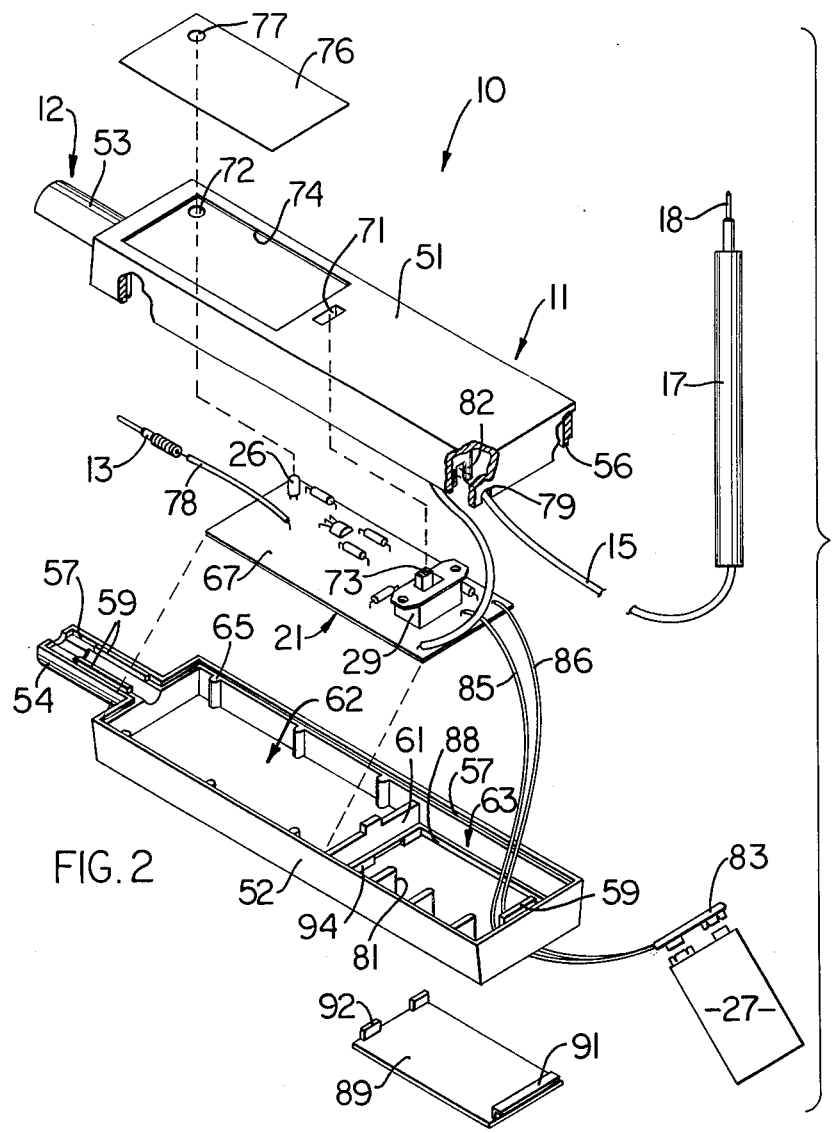
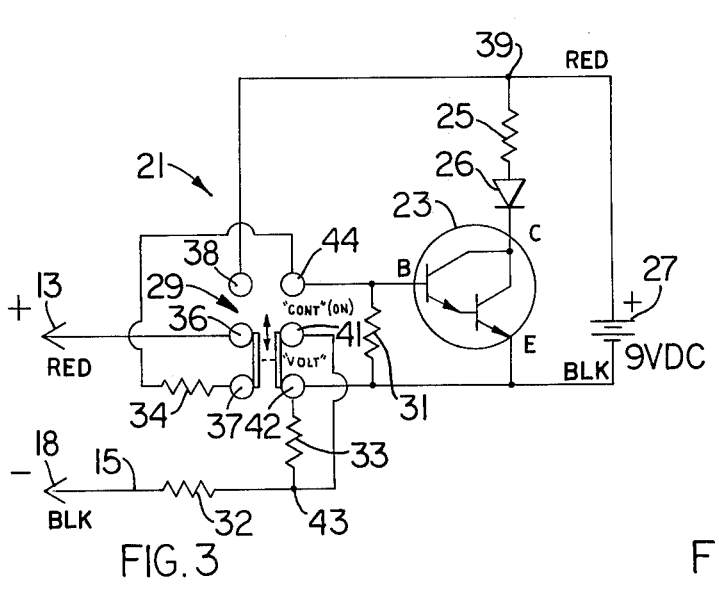
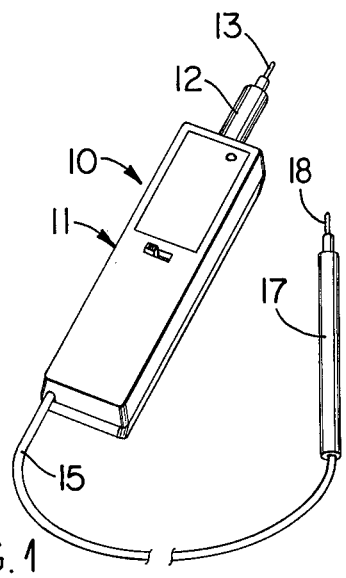

4,027,236

VOLTAGE AND CONTINUITY CHECKER

FIELD OF THE INVENTION

This invention relates to a compact electrical tester and more particularly relates to a self-protecting portable instrument for testing electrical continuity, voltage and polarity.

BACKGROUND OF THE INVENTION

Relatively compact electrical testers which are normally hand held in use and sufficiently compact to be carried in the user's pocket, which provide a very simple signal output, without recourse to meters, digital read outs or the like, have long been known. However, past devices of which I am aware have not been fully satisfactory and have suffered from one or more disadvantages. For example, certain of these prior devices have been incapable of testing the full range of commonly desired electrical characteristics, including circuit continuity, voltage and polarity (e.g., DC voltage polarity and diode polarity). Oftentimes, those prior devices capable of both voltage and continuity tests have utilized separate circuits for each, increasing circuit complexity and cost. Frequently, prior devices have resorted to plural and often different indicator devices for providing the results of different tests and/or have been usable over only a relatively narrow voltage and/or resistance range. Indicators on prior test devices have frequently been light sources which vary substantially in output over the usable range of the instrument so as to be misleading or difficult to read under varying ambient light conditions. Complexity of circuitry or mechanical construction has also been a problem.

Further, little has been done, insofar as I am aware, to avoid damage to the tester during use, particularly instrument damage due to operator inattention or misuse. Such instrument damage is particularly a problem with test instruments of the type capable of testing parameters of both "live" circuits and non-energized circuits or components, i.e., capable of testing both voltage and continuity.

Thus, the objects and purposes of this invention include the provision of:

1. An instrument for testing electrical continuity, voltage and polarity wherein, within the operating voltage range of the instrument, the instrument is protected against inadvertent connection across a voltage source while in its continuity mode.

2. An instrument, as aforesaid, capable of testing both AC and DC voltages over a wide voltage range, capable of indicating DC voltage polarity, capable of continuity testing over a wide resistance range and capable of checking polarlity of a polarized nonlinear device such as a diode, and which provides a "GO-NO GO" indication for each such test.

3. An instrument, as aforesaid, which is capable of providing an indication for all of these different types of tests with a single visible indicator of light-emitting type, and the instrument includes a single circuit loop containing the indicator light source and an electrical supply which for all types of tests provides in normal use the sole current source for the indicator light.

4. An instrument, as aforesaid, in which the indicator is a low current drain, substantially constant light output illumination source.

5. An instrument, as aforesaid, which includes a manual switch actuable to alternatively select voltage and continuity modes of the instrument wherein the light source is protected against damage from connection of the instrument to a voltage source with such manual switch in continuity position.

Other objects and purposes of this invention will be apparent to persons acquainted with apparatus of this general type upon reading the following specification and inspecting the accompanying drawings.

BRIEF DESCRIPTION OF THE DRAWINGS

FIG. 1 is a pictorial view of an instrument embodying the present invention.

FIG. 2 is an enlarged, exploded, pictorial view of the instrument of FIG. 1, showing the interarrangement of parts thereof.

FIG. 3 is a diagram of the circuit of the instrument of FIG. 1.

Certain terminology will be used in the following description for convenience in reference only and will not be limiting. Words "front" and "rear" will refer to the leftward and rightward ends of the apparatus as it is shown in FIGS. 1 and 2. The words "in" and "out" will refer to directions toward and away from, respectively, the geometric center of the device and designated parts thereof. Such terminology will include derivatives and words of similar import.

SUMMARY OF THE INVENTION

The objects and purposes of the invention are met by providing a portable test instrument capable of testing electrical continuity, voltage and polarity (of DC voltage sources and of non-linear devices such as diodes). An indicating circuit loop includes the main current electrodes of a high gain amplification device, and LED, a protective resistance and a DC voltage supply. The amplification device includes a control electrode. Test probes connect to the aforementioned circuitry through a voltagecontinuity mode selector switch interposed in a resistance network. Selection of the voltage position of the switch provides a series high resistance path between the test probes, across a portion of which the control electrode and one of the main electrodes of said amplification device are connected. Selection of the continuity mode connects the test probe in a different manner through such resistance network to permit application of current from the instruments electrical supply through the probes when the latter are connected across a conductor path to be tested, permit such conduction through said probes to trigger the electronic switch, and yet block large current flow through the indicator should the probes erroneously be placed across an external voltage source with the test switch in continuity position.

DETAILED DESCRIPTION

FIG. 1 shows an instrument 10 embodying the invention. The instrument 10 includes a casing 11 of generally rectilinear form, from the front end of which extends a hollow tubular extension 12 from which a test probe 13 forwardly extends. An insulated conductor 15 extends from the casing 11, conveniently at the rearward end thereof as shown, and at its remote end extends through an insulated handle 17 and terminates in a further test probe 18. The test probes 13 and 18 are electrically conductive and in a convenient configuration. In the embodiment shown, both are slim, elongate prods, though other probe types, particularly for the remote probe 18, are contemplated, an example being a conventional alligator clip.

Disposed in the casing 11 is a test circuit 21, shown schematically in FIG. 3. The circuit 21 includes a high gain semiconductor device 23, here employed as an electronic switch. In the preferred embodiment shown, the device 23 is a dual transistor device comprising a Darlington connected transistor pair in a single envelope. The Darlington transistors are here of NPN type. It will be understood that PNP types may be used with appropriate polarity reversal and other components of the associated circuitry. The collector C and emitter E of the output transistor of the Darlington pair 23 form the main current electrodes of the Darlington unit and the base B of the input transistor of the Darlington pair forms the control electrode for the Darlington unit.

A current limiting resistor 25 and a light-emitting diode (LED) 26 connect in series with the main current electrodes C and E of the Darlington device 23. The LED is oriented for conduction in the same direction as the main electrodes C and E, as shown. The sole current path through the LED 26 is thus one where current is controlled by the Darlington unit 23 and in addition is limited by resistor 25 sized to guard against damage or destruction of the LED even where the test instrument is used improperly as hereafter discussed.

Connected across the series path including resistor 25, LED 26 and Darlington electrodes C and E, is an internal DC supply, preferably a conventional nine-volt battery 27. The battery 27 is poled to flow current through the series resistor 25, LED 26 and main Darlington electrodes C and E, respectively, and in proper use of the instrument 10, in either of its voltage and continuity mode, constitutes the sole current source for the LED 26.

The test probes 13 and 18 are both separated from the abovementioned circuitry by a manually shiftable mode selector switch 29 (preferably a double-throw switch) and a four element resistive network, provided by resistors 31-34.

The resistor 31 connects the control electrode B with main electrode E of the Darlington unit 23. Resistor 32 connects through conductor 15 to the test probe 18, which is here the negative polarity probe. The switch 29 and remaining resistors 33 and 34 are so arranged that in the voltage position of the switch, the test probe 13 connects serially through resistor 34, resistor 31 and resistor 32 to the negative test probe 18 so as to provide a high input impedance for the circuit in its voltage test mode, such impedance preferably being about 2.5 M ohm. In the continuity test mode, on the other hand, the switch 29 connects the test probe 13 directly to the junction point between current limiting resistor 25 and the positive side of battery 27, and connects the remaining or negative test probe 18 through resistor 32 to control electrode B of the Darlington unit 23, with resistors 31 and 33 connected in parallel from control elctrode B to the lower main electrode E of the Darlington unit 23.

To carry out these voltage and continuity test connections, the double-pole double-throw switch 29 is connected as follows. The switch 29 has a first movable contact 36 connected conductively to the positive test probe 13 and alternatively engageable with a first voltage mode contact 37 and a first continuity mode contact 38, the latter being connected to the junction point 39 between limiting resistor 25 and battery 27.

The switch 29 further includes a second movable contact 41 connected through resistor 32 and conductor 15 to the negative test probe 18. The second movable contact 41 is engageable with a second voltage test contact 42 to which are connected Darlington emitter E and the negative side of battery 27. The resistor 33 interconnects such second voltage test contact 42 and a point 43 between second movable contact 41 and resistor 32. Second movable contact 41 is alternatively positionable in contact with a second continuity mode contact 44, which connects to the control electrode B of Darlington unit 23. Also, the mentioned first voltage mode contact 37 connects through resistor 34 and contact 44 to such control electrode B.

In the preferred embodiment shown, where battery 27 is a nine-volt battery, resistors 25, 33 and 34 are of about 470 k ohms resistance and resistors 31 and 32 are of about 1 m ohm resistance.

In the preferred embodiment shown, the casing 11 comprises substantially rectilinear upper and lower half shells 51 and 52 (FIG. 2) which respectively integrally carry upper and lower halves 53 and 54 of the forward tubular extension 12. The casing 11 is preferably of molded plastics material. For accurate assembly together to form a closed casing, the upper and lower half shells 51 and 52 have complimentary perimetral lip and relief portions 56 and 57, respectively. Platelike integral glue dams 59 at the rear and front of the lower shell 52 are disposed just inside the relief 57 and retain adhesive therein for securing together the upper and lower casing shells 51 and 52. Integral transverse bulkheads in the upper and lower half shells 51 and 52 (only the bulkhead 61 in the lower half shell being shown) subdivide the casing 11 into a forward circuitry compartment 62 and a rearward battery compartment 63.

Upstanding ribs 65 preferably molded into the circuitry compartment side walls of the lower shell 52 and opposed, corresponding ribs of the upper shell 51 sandwich the side edge portions of a printed circuit board 67 therebetween, the length and width of the board 67 corresponding to that of the circuitry compartment 62 so as to fixedly locate the board 67 within the housing 11 when the shell 51 and 52 are assembled together. The printed circuit board 67 is used to mount and appropriately electrically interconnect the circuit components above-described and shown in FIG. 3, namely components 23, 25, 26, 29 and 31–34. In general, mounting of such components on the board 67 is conventional i.e., with leads of such components passing down through openings in the insulative board 67 and being soldered to conductive foil lengths on the opposite side which interconnect such leads in the manner shown in FIG. 3. Shells 51 and 52 are sufficiently deep so as not to interfere with such components on board 67, except that openings 71 and 72 in the mid and forward portions of the upper face of upper shell 51 respectively receive the manually engageable handle 73 of switch 29 and the light emitting cap of the LED 26. The switch handle 73 protrudes sufficiently through the opening 71 as to be manually actuable with the casing 11 fully assembled and with the board 67 therein. The LED 26 is clearly visible through opening 72 and may protrude somewhat thereinto but preferably not therebeyond. In the preferred embodiment shown, the upper face of upper shell 51 has a shallow recess 74 in the area of opening 72 and near opening 71, for receiving adhesively therein a placard 75. Conveniently the placard 76 displays operating instructions, voltage limits, switch position indications and the like, usable by the operator. The placard 76 preferably has a transparent area 77 (or less preferably a hole therethrough) above the opening 72 through which the illuminated or nonilluminated condition of the LED 26 is clearly visible to the operator.

The probe 13 is preferably a conventional conductive tip having an enlarged rearward portion which is snugly receivable and held fixedly between the parts 53 and 54 of the forward extension 12, the rearward end of such tip 13 being connected to an insulated conductor 78 in turn connected through appropriate foils of circuit board 67 to the switch 29 as schematically indicated in FIG. 3. Similarly, the circuit end of conductor 15 connects to the circuitry on the board 67 in the manner shown schematically in FIG. 3 and is led out of casing 11 through a notch 79 in the rear wall of one of the casing shells.

Laterally extending integral fins 81 laterally locate the battery 27 in the lower shell 52, corresponding downwardly extending pins 82 being provided in the battery portion of the upper shell 51 to cooperate with fins 81. The battery 27 is connected to foils of the printed circuit board through a conventional terminal cap 83 and insulated leads 85 and 86 to effect the battery connection shown in FIG. 3. An opening 88 in the bottom of the battery compartment, through the bottom wall of shell 52, permits rapid and easy installation and replacement of the battery 27. The opening 88 is normally closed by a removable door 89 provided at its rearward end with a generally L cross-section flange 91 to overlie the remnant of the bottom wall of shell 52, behind opening 88. The door 89 is also provided with upstanding tabs 92 at its forward edge which are somewhat flexible and which engage, substantially with a snap fit, the forward edge portions 94 of opening 88 to latch the door 89 in closed relation in the opening 88 thereby retaining battery 27 within the casing 11.

The pins 82, being offset laterally from the side wall of upper shell 51 form therewith a channel through which insulated conductor 15 is led from notch 79 to circuit board 67.

OPERATION

While the operation of the invention has been generally indicated above, same will now be summarized for clarity.

With the instrument fully assembled and the battery 27 in place, the mode switch 29 is shifted to its voltage position, shown in FIGS. 2 and 3, and probes 13 and 18 are placed across an external voltage source (not shown) to be tested. With a voltage across the probes, current flows through the series path comprising switch contacts 36 and 37, resistor 34, switch contact 44, resistor 31, switch contacts 42 and 41, and resistor 32. The chain of resistors 34, 31 and 32 divides the input, or test, voltage so that a proportional amount (here about 40%), appears across electrodes B and E of the Darlington transistor unit 23. If the external source voltage across probes 13 and 18 is above the lower voltage threshold of the circuit (in the preferred embodiment about four volts) and such voltage source is AC or DC with the positive side connected to probe 13, the current flow through such resistor chain will turn on the Darlington transistor unit 23. When the Darlington unit 23 is on, it permits a sufficient current (in the preferred embodiment shown about 12mA) to flow through the limiting resistor 25 and the LED, causing the LED 26 to light.

If the input voltage across probes 13 and 18 is too low (or is negative DC), the Darlington unit 23 remains off. The requirement for a positive DC voltage allows the instrument 10 to test DC voltage polarity as well as voltage magnitude. For convenient use, the probes 13 and 18 have color coded supports, e.g. the casing 11 is red and handle 17 is black.

The Darlington transistor unit 23 isolates the high voltage input (in the present embodiment up to 600 volts maximum) from the LED indicator 26. Due to the high input impedance (in the present embodiment 2.5 M ohms) of the circuit, the indicating LED is on with uniform brightness throughout its wide sensitivity range (in the preferred embodiment from about 4 volts to about 600 volts.

To check continuity through a conductive circuit element or portion of a circuit, the mode switch 29 is shifted from its voltage position shown to its continuity position, that is so that shiftable contacts 36 and 41 disengage contacts 37 and 42, respectively, and instead engage contacts 38 and 44 respectively. With an unknown circuit, circuit portion or element (conductive or of moderate resistance and not a voltage source) connected between the probes 13 and 18, the battery 27 conducts through junction point 39, contacts 38 and 36, probe 13, the unknown circuit under test, and thence through probe 18, resistor 32, and switch contacts 41 and 44 and thence through the path within Darlington unit 23 from control electrode B to main electrode E to the negative side of battery 27. If indeed the circuit under test is conductive or with very low resistance, the battery 27 in the present embodiment provides a very small current (about 9 micro-amperes maximum) through resistance 32 and the control electrode B. If the unknown circuit has a DC impedance below the limit of the instrument (herebelow about 1 M ohm) the current flowing through the control electrode B will be sufficient to turn on the Darlington unit 23. When the Darlington unit 23 is on, a much larger current (here about 12mA) is caused by the battery 27 to flow through the limiting resistor 25, LED 26 and the main electrodes C and E of the Darlington unit 23. This current causes the LED to light, just as in the voltage test situation above described.

On the other hand, if the unknown impedance across probes 13 and 18 is too high, (in the present embodiment 1 M ohm or larger) the resulting battery current to the control electrode E is too low and the Darlington unit 23 remains off.

It will be noted that the resistors 33 and 31, in the continuity mode, connect in parallel across the electrodes E and B of the Darlington unit and thus provide base bias to the Darlington unit in response to the above-mentioned current flow provided by battery 27 through the unknown impedance connected between the probes 13 and 18.

If the unknown circuit or element has a polarized impedance (is for example a diode), the impedance thereacross will be low in one direction (the forward direction) and high in the other direction (the reverse direction). In this manner, the polarity of an unmarked diode can be determined, diodes can be tested for shorts and open conditions, etc.

Although the present instrument has its mode switch clearly labeled, it is always possible that a human operator may err and connect probes 13 and 18 across voltage supply with switch 29 still in it continuity mode. Voltages even well below the maximum operating voltage (in this embodiment 600 volts) of the instrument, if applied directly across the LED 26 would destroy it, rendering the instrument useless. However, the present circuit protects the LED 26 against damage when the probes 13 and 18 are placed across a voltage source within the voltage maximum (e.g. 600 volts) of the circuit, though the mode switch 29 be in its continuity position. More particularly, current from such a current source could reach the LED only through a series path including high resistance elements 26 and 32 and additionally including either the base-collector path of the input transistor of the Darlington unit, or the main current electrode paths C, E of the Darlington with paralleled resistors 31 and 33 in series therewith. Thus, through erroneously in continuity mode and with probes 13 and 18 across the voltage source, the LED 26 is protected against damage by the effective high input impedance of the circuit 21 even in its continuity mode, as long as the voltage supplied by the unknown source is below the operating limit of the circuit (here 600 volts).

For continuity measurements in the continuity mode of the present circuit, the LED will be off for impedances across probes 13 and 18 above 1 M ohm and will be on for impedances across the probes 13 and 18 below 1 M ohm. It may be noted that in continuity mode, the LED will light (though not be damaged) in response to connection of the probes 13 and 18 across an AC voltage source of 600 volts or under or a DC voltage source in the range plus 4 volts DC to minus 600 volts DC, with DC polarity referenced to the probe 13.

The instrument 10 has a self-checking capability. Particularly, with mode switch 29 in continuity position, proper circuit operation is indicated by lighting of LED 26 when probes 13 and 18 are brought into contact with each other.

The present invention can be used for a wide variety of continuity tests including, for example, general or household wiring for shorts in and opens, automotive trouble-shooting, lamps, switches, relay contacts heater bands, motors, etc. Similarly, the instrument is usable for a variety of voltage tests, including automotive trouble-shooting, trailer hookups, home wiring, trouble-shooting, machine electrical panel trouble-shooting, electronic device testing, etc.

High circuit input impedance (e.g. 2.5 M ohm) is combined in the present invention with relatively high instrument input sensitivity (voltages down to 4 volts and continuity to the relatively high test impedance of 1 M ohm) by use of a very high gain Darlington amplifier 23 as an electronic switch. The LED 26 provides a substantially constant brightness throughout substantially its full operating range.

Although a particular preferred embodiment of the invention has been disclosed in detail for illustrative purposes, it will be understood that variations or modifications of the disclosed apparatus, including the rearrangement of parts, lie within the scope of the present invention.

The embodiments of the invention in which an exclusive property or privilege is claimed are defined as follows:

1. A portable instrument for testing electrical continuity, voltage and polarity, comprising in combination: electronic switch means having main current electrodes and a control electrode actuable for contolling current flow through said main electrodes;

an electrical supply, an indicator and current limiting means connected in series loop with said main current electrodes, wherein current flow through said main current electrodes controls actuation of said indicating means in both the voltage and continuity test modes of the test instrument;

a pair of test probes;

an input impedance network comprising first, second and third impedances in series from one said test probe to said control electrode, respectively, wherein the junction point of said second and third impedances connects to one of said main electrodes such that said third impedance connects across the control electrode and said one main electrode of said electronic switch means, said impedance network further including a fourth impedance connectible between the other test probe and said control electrode only in the voltage test mode of said instrument;

switch means including voltage test terminal means selectable for connectively shunting said seond impedance and for establishing said connection of said other test probe with said control electrode through said fourth impedance, said switch means also including continuity test terminal means selectable for conductively connecting said other test probe to said current limiting means and electrical supply of said series loop and for conductively joining the juncture of said first and second impedances with the juncture of said third impedance and control electrode whereby the series loop comprising the main electrodes of said electronic switch means, said electrical supply of said instrument, said indicator means and said current limiting resistor provides the sole current supply loop for said indicator means in continuity and voltage testing in said continuity and voltage test modes respectively, said indicator means being protected from externally initiated current flow in response to connection of the test probes to a voltage source while the instrument is in continuity mode at least by said current limiting means of said series loop and said first impedance.

2. The apparatus of claim 1, in which said indicating means is an LED, said electrical supply is a battery and said current limiting means is a resistor, said first, second, third and fourth impedances being resistors.

3. The apparatus of claim 2, in which said first and third impedances are resistors of similar resistance approximately in the range of 1 M ohm and said current limiting means and second and fourth impedances are resistors are of resistance value approximately one-half that of said first and third resistors.

4. The apparatus of claim 3, in which said electronic switch means comprises a Darlington transistor, said switch means comprising a double-pole, double-throw switch having movable contacts, one of which connects through said first resistance to said one test probe and is shiftable to selectively connect said first resistance in the voltage test mode to the common point of said second and third resistances and in said continuity test mode to said control electrode, said switch having a further movable contact connected to said other test probe and in said voltage test mode connectible through said fourth resistance to said control electrode and in said continuity test mode conductively to said series loop between said electrical supply and protective resistance.

5. A portable instrument for checking electrical continuity, voltage and polarity, comprising in combination:

electronic switch means having a control electrode and main current electrodes controlled thereby;

current limiting means in series with said main electrodes and an LED serially interposed between said current limiting means and said electronic switch means and poled for conduction in series with the latter to provide a visible test indication;

portable electrical supply means connected across the series current limiting means, LED and main electrodes so as to provide operating current for said LED in both voltage and continuity test modes of the instrument upon conduction of said electronic switch means;

first and second test probes and a first resistance in series with said second test probe;

switch means actuable to a voltage test position in which said seocnd test probe connects through said first resistance to a point between said electrical supply and the adjacent one of said main electrodes and including means connecting said first test probe to said control electrode, said switch means being actuable to a continuity test position and including means in such continuity test position connecting said second test probe through said first resistance to said control electrode and connecting said first test probe conductively to the junction point of said electrical supply and current limiting means;

whereby said electrical supply can actuate said control electrode by conduction through a conductive test member contacted by said probes and said first resistance so as to cause indicating current flow through said main electrodes and indicating means, but wherein a voltage source if erroneously connected across said test probes with said switch means in said continuity position can supply only a limited magnitude of current through said LED, to the extent permitted by said current limiting means and first resistance.

6. A portable instrument for testing electrical continuity, voltage and polarity, comprising in combination:

a substantially rectilinear casing having a forward extension for mounting a first conductive probe and a second conductive probe communicating with said casing through an elongate conductor, said casing comprising upper and lower substantially rectilinear, cup-shaped shells with opposed perimetral walls whose opposed edges are provided with complementary relief and lip portions extending through the rectilinear and extension portions of the casing shells to positively register the shells with respect to each other when brought together to form said casing, said casing further including dam means along lengths of said relief portions to facilitate adhesive joining of said casing shells to each other, said casing further including means dividing same into a forward compartment communicating with said forward extension and a rearward compartment;

a printed circuit board configured for a snug lateral fit within said forward compartment just inboard of said lip and relief portions, said shells having opposed upstanding ribs extending laterally into said forward compartment and of length to snugly grip the perimetral portion of the printed circuit board therebetween with said shells assembled, so as to positively locate said printed circuit board within said forward compartment, and conductive means extending from said board into said forward extension and electrically connected to said first probe supported in and extending forward from said extension;

battery leads extending from said circuit board into said rear compartment, said rear compartment housing fins extending laterally thereinto from the side walls of said shells for snugly locating a battery in said rearward compartment, the fins of one said shell being notched for guiding said elongate conductor from said circuit board out of the casing to the second probe, said casing further including means for opening said rearward compartment to permit insertion or removal of a battery;

said circuit board supporting electronic switch means and a visible indicator and current limiting means all connected in series with said battery leads for flowing indicator energizing current through said indicator upon actuation of said electronic switch means and means in one said casing shell rendering said indicating means visible from outside said casing, a manually actuable switch on said circuit board and means in one said casing shell rendering said switch actuable from outside said casing, and a four element resistance network and means interconnecting same with a control electrode of said electronic switch means, said manual switch, and the conductors leading to said probes for arranging a combination of three said resistors in the control electode circuit of said electronic switch means in one position of said manually actuable switch means but arranging a different combination of three of said resistors in the control electrode circuit of said electronic switch means in a second position of actuation of said manual switch means, said manuable switch means being shiftable between a continuity test position and a voltage test position and in said continuity test position providing for series connection with said probes and indicator of a high resistance including said current limiting means and at least one of said four resistors.

* * * * *